(12) United States Patent
Hsuan et al.

(10) Patent No.: US 6,268,642 B1
(45) Date of Patent: Jul. 31, 2001

(54) WAFER LEVEL PACKAGE

(75) Inventors: Min-Chih Hsuan, Hsinchu; Cheng-Te Lin, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/299,706

(22) Filed: Apr. 26, 1999

(51) Int. Cl.[7] .................................................. H01L 23/544
(52) U.S. Cl. ...................... 257/620; 257/686; 257/780; 257/773; 257/621; 257/622; 257/623; 257/624; 257/626; 257/738; 257/772
(58) Field of Search ................................ 257/620, 686, 257/780, 779, 621, 622, 623, 624, 626, 738, 772, 773; 438/113, 114, 110

(56) References Cited

U.S. PATENT DOCUMENTS 4,984,358 * 1/1991 Nelson ...................................... 29/830
6,022,791 * 2/2000 Cook et al. ............................ 438/458

* cited by examiner

*Primary Examiner*—Minh Loan Tran
*Assistant Examiner*—Luan Thai

(57) ABSTRACT

A wafer level package structure. The method of forming the wafer level package structure includes covering a silicon chip having a plurality of integrated circuit devices thereon with an insulation layer. Next, a plurality of bonding pads is formed on the periphery of the silicon chip above the insulation layer. The bonding pads are formed such that each bonding pad is electrically connected to the terminal of an integrated circuit device. Thereafter, a passivation layer is deposited over the insulation layer and the bonding pads, and then openings that expose a portion of the bonding pad are formed. Subsequently, a metallic layer is formed on the sidewalls and the exposed bonding pad area. The metallic layer also extends over the passivation layer in the neighborhood of the opening and towards the edge of the wafer chip. Next, a layer of packaging material is deposited over the passivation layer. Finally, a metallic bump is formed over the exposed metallic layer lying above each opening.

21 Claims, 7 Drawing Sheets

WAFER LEVEL PACKAGE

BACKGROUND OF THE INVENTION

1. Field of Invention

The present invention relates to a wafer level package. More particularly, the present invention relates to a wafer level package having a button type of contact for engaging with a carrier.

2. Description of Related Art

Following the recent discovery of innovative fabricating techniques in the semiconductor industry, electronic devices are used in a host of electronic products. In general, the manufacturing of semiconductors can be divided into three main stages. In the first stage, a semiconductor substrate is formed. In other words, a single-crystal silicon wafer is grown using epitaxial growth techniques. Next, semiconductor devices such as MOS transistors with all the necessary metallic interconnects for linking various devices are formed. Finally, the silicon chips within the silicon wafer are cut out and then packaged. At present, the design of nearly all packages is aimed towards lighter weight, smaller thickness and installation convenience. Hence, the trend in semiconductor manufacturing is towards an increase in the level of integration, whereas the trend in packaging is to reduce package volume as much as possible. Therefore, packaging techniques such as chip scale package (CSP), multi-chip module (MCM) and chip level package (CLP) have been developed. Because the manufacturing of devices having a line width smaller than 0.18 μm is now possible, the level of integration has increased tremendously. At present, chip manufacturers are looking for packaging methods that can package a silicon chip into the smallest volume. Therefore, packages having a three-dimensional stack-up structure are now being developed. By stacking silicon chips up or stacking silicon chip packages up, overall volume of the ultimate package can be greatly reduced.

FIG. 1 is a cross-sectional view showing the stack-up structure of several integrated circuit packages according to a conventional three-dimensional package. Silicon chips 110a, 110b and 110c are respectively wire-bonded to their lead frames 114a, 114b and 114c. Next, the silicon chips and portions of the lead frames are enclosed by molding material 116, for example, epoxy to form individual silicon chip packages 118a, 118b and 118c respectively. Utilizing the different degree of bending of the outer leads at the outer portions of various lead frames 114a, 114b and 114c, chip packages 118a, 118b and 118c are stacked on top of each other three-dimensionally. The outer leads of the chip package 118c, which lies at the bottom of the stack, are connected to the contact points of a printed circuit board 120. This type of packaging technique is most frequently employed in tape automatic boding (TAB) package.

Although the conventional stack-up type package structure is capable of reducing volume occupation of the final package, suitable carriers (lead frame) have be used to support various silicon chips in addition to the individual or group molding operations required. Hence, not only will the thickness of individual chip packages be increased, the overall thickness of the final stacked type package will be increased as well. Furthermore, since signals to or from the conventional stacked type package must go through a longer conductive path that includes conductive wires and leads, impedance will be increased. Therefore, signal decay and signal delay will increase.

In addition, as soon as the fabrication of the integrated circuit on a semiconductor substrate is complete, a multiple of testing operations has to be carried out such as a probing test, a final test and a burn-in test. Moreover, packaging operations such as wire bonding, molding, lead forming and assembly tests must be conducted once these tests are finished. These operations not only complicate the manufacturing process, but the cost of production will increase as well.

In light of the foregoing, there is a need to provide a simpler chip packaging structure that can eliminate most of the aforementioned processing complications.

SUMMARY OF THE INVENTION

Accordingly, the present invention provides a wafer level package having button type contacts on the periphery of each package. Hence, each package can form an electrical connection with a carrier or a printed circuit board directly without using any intermediate connecting medium or having to go through complicated packaging operations. Since the traveling distance of signals will be reduced, the impedance will be reduced. Therefore signal decay and delay are prevented.

A second aspect of this invention is to provide a wafer level package whose thickness does not differ too much from the thickness of a silicon chip, thereby achieving package miniaturization.

A third aspect of this invention is to provide a wafer level package structure suitable for three-dimensional stacking.

A fourth aspect of this invention is to provide a silicon wafer having a plurality of wafer level packages. A plurality of testing circuits is formed on the scribe line sections between the packages. Moreover, the testing circuits are connected to contact points along the periphery of the packages. Consequently, there is no need to perform probe test on the wafer. The final test and the burn-in test can be carried out directly in the wafer stage, and hence testing procedures are simplified and the cost of testing is lowered.

To achieve these and other advantages and in accordance with the purpose of the invention, as embodied and broadly described herein, the invention provides a wafer level package. The method of forming the wafer level package comprises covering a silicon chip having a plurality of integrated circuit devices thereon with an insulation layer. Next, a plurality of bonding pads is formed on the periphery of the silicon chip above the insulation layer. The bonding pads are formed such that each bonding pad is electrically connected to the terminal of an integrated circuit device. Thereafter, a passivation layer is deposited over the insulation layer and the bonding pads, and then openings that expose a portion of the bonding pad are formed. Subsequently, a metallic layer is formed on the sidewalls and the exposed bonding pad areas. The metallic layer extends over the passivation layer in the neighborhood of the opening and towards the edge of the wafer chip. Next, a layer of packaging material is deposited over the passivation layer. Finally, a metallic bump is formed over the exposed metallic layer lying above each opening.

The silicon wafer for forming the wafer level packages having the aforementioned structure also has a number of circuits and contact points on its scribe line sections for chip testing. These testing circuits on the scribe lines can be connected to various packages via the metallic layer above the bonding pads. Alternatively, the circuits can be connected to various packages through multi-level metallic interconnects.

According to one preferred embodiment of this invention, the metallic bumps having a button shape are formed using a lead-tin alloy. The metallic bumps serve as contacting points between the wafer level package and the metallic contacts on a package carrier. Alternatively, the metallic bumps can join directly with the corresponding metallic contacts on a printed circuit board. Consequently, signal transmission path is shortened resulting in the lowering of circuit impedance. Moreover, since the layer of packaging material is deposited directly over the chip, the thickness of each package will increase just a little. Hence, thickness of the final package will not differ too much from the original wafer chip, thereby achieving package miniaturization.

In addition, this invention has button shape metallic contacts along the edge of the wafer level package. Therefore, the upper surface or the outer edge of the metallic bumps can be used as contacting areas for connecting with external circuits. The button type contact is particularly suitable for three-dimensional stacking of the wafer level packages. In the presence of a suitable package carrier, the wafer level packages of the invention can be stacked on top of one another. Moreover, each wafer level package is rather thin, and hence the stacked structure will have a small overall thickness. Consequently, not only is the overall volume of the stacked package reduced, the signal transmission path is shortened as well.

Furthermore, because the testing circuits are formed on the scribe lines and no packaging is needed after the contact buttons are formed, there is no need to perform a probe test. Moreover, the final test and the burn-in test can be conducted before the silicon wafer is cut up into separate wafer level packages. Since final test and burn-in test can be conducted in the wafer stage and there is no need to perform a probe test, testing procedures are simplified and testing cost is lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
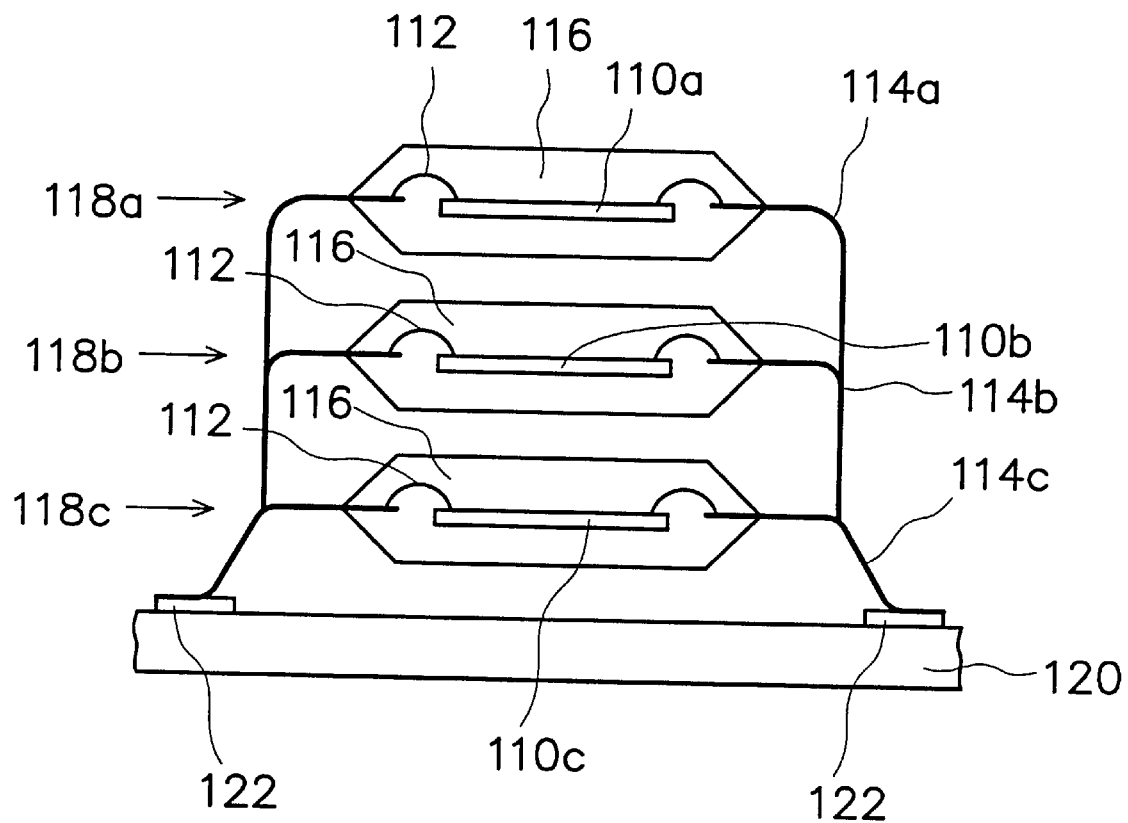
FIG. 1 is a cross-sectional view showing the stacked structure of several integrated circuit packages according to a conventional three-dimensional package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
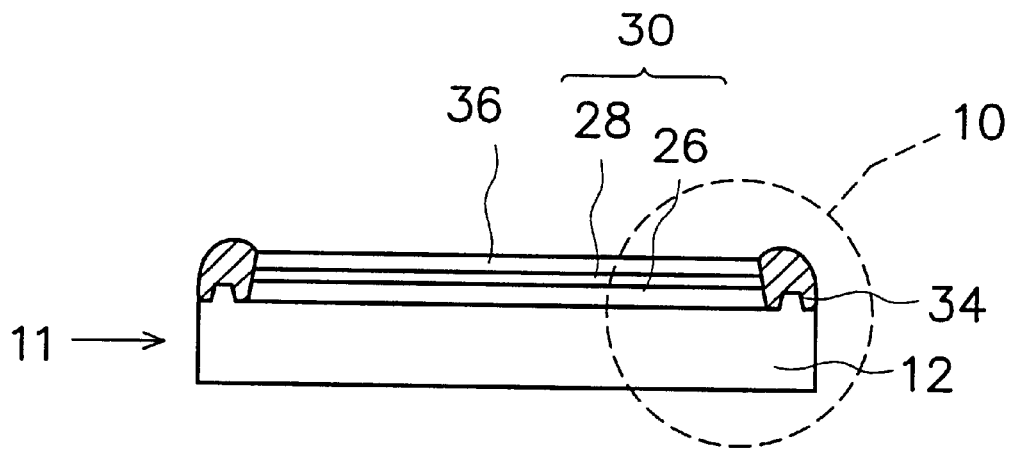
FIG. 2A is a cross-sectional view of a wafer level package according to the invention.
Figure 2B:
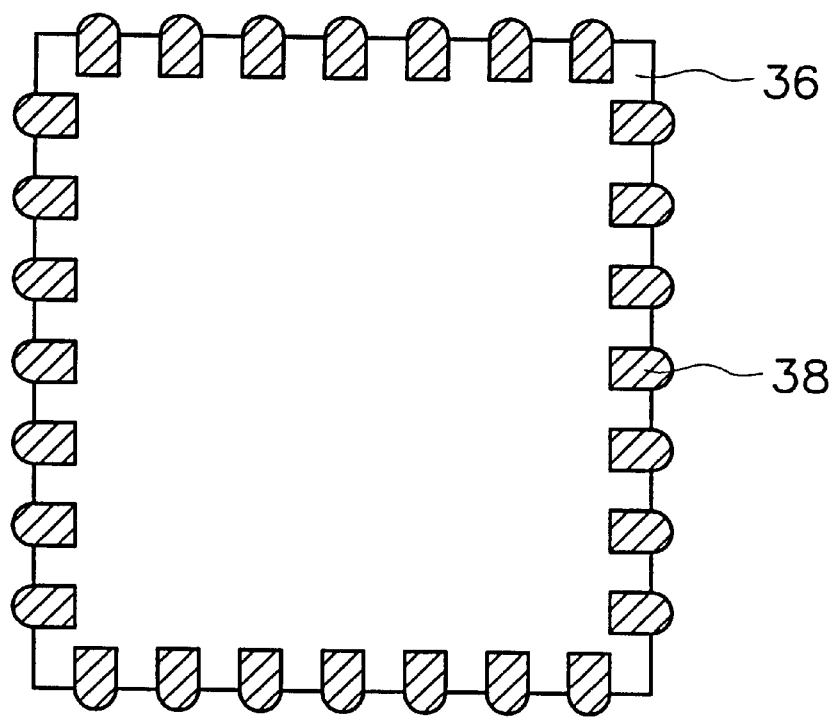
FIG. 2B is a top view of the wafer level package as shown in FIG. 2A.
Figure 2C:
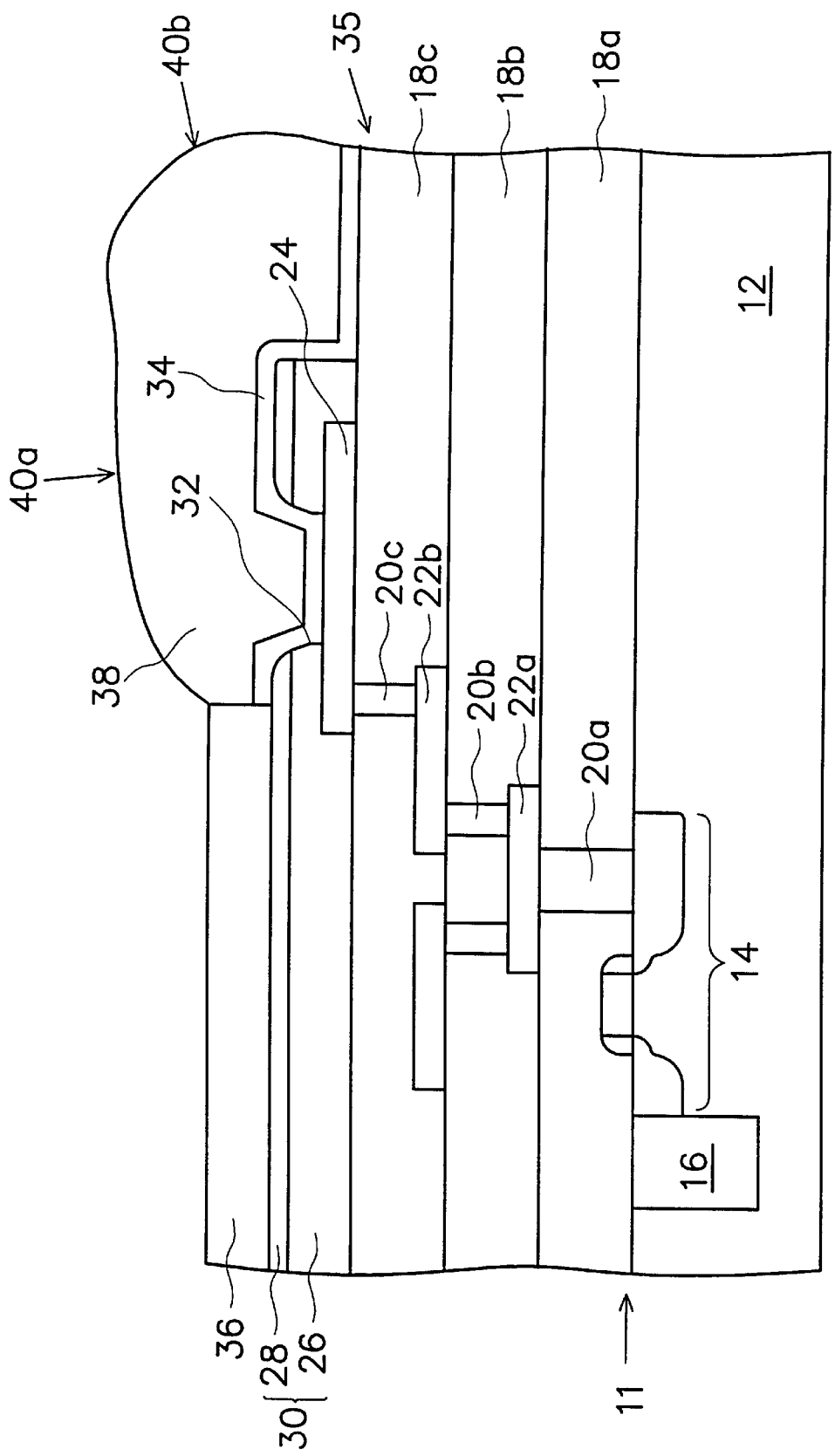
FIG. 2C is a magnified view of the area 10 in FIG. 2A.

FIGS. 2A through 2C are diagrams showing a wafer level package according to one preferred embodiment of this invention. FIG. 2A is a cross-sectional view of a wafer level package according to the invention. FIG. 2B is a top view of the wafer level package as shown in FIG. 2A, while FIG. 2C is a magnified view of the area 10 in FIG. 2A. The wafer level package of this invention is built upon a semiconductor chip 11. The semiconductor chip 11 includes a substrate 12 (for example, a silicon substrate) having a number of integrated circuit devices 14 thereon. These integrated circuit devices 14, for example, can be MOS devices, resistors, capacitors, inductors or bipolar junction transistors. Each integrated circuit device 14 is isolated from its neighbor using an isolation structure 16 such as a shallow trench isolation (STI) structure. The integrated circuit devices 14 are covered by several insulation layers 18a, 18b and 18c. Through metallic interconnects 22a and 22b that run inside the insulation layers 18b and 18c as well as metal plugs 20a, 20b and 20c inside insulation layers 18a, 18b and 18c respectively, an intricate circuit network is formed. A bonding pad 24 is formed on the uppermost insulation layer 18c. The bonding pad 24 is electrically connected to one terminal of an integrated circuit device 14 via metallic interconnects. Hence, external electrical signals can be transmitted to the integrated circuit device 14 and vice versa. There is another insulation layer 26 deposited over the bonding pad 24. The insulation layer 26 can be a silicon oxide, silicon nitride or a combination of both, for example. In general, an organic insulation layer 28, for example, a polyimide layer, is also deposited over the insulation layer 26. The insulation layers 26 and 28 together constitute a passivation layer 30 capable of protecting the integrated circuit devices 14 and various metallic interconnects. However, the passivation layer 30 has a few openings 32 that expose a portion of the bonding pad 24. The opening 32 can be formed, for example, by photolithographic and etching operations. A metallic layer 34 is deposited over the interior surface of the opening 32, the exposed bonding pad 24 as well as a portion of the organic insulation layer 26 in the neighborhood of the opening 32. The metallic layer 34 even extends to the edge 35 of the silicon chip 11. The metallic layer 34 mainly functions as a media between the bonding pad 24 with subsequently deposited contact point material. The metallic layer can be formed using copper, nickel, silver, palladium, palladium-nickel alloy, gold, titanium nitride or various combinations of the above materials. In addition, a packaging layer 36 such as an epoxy layer is formed over the passivation layer 30. Finally, metal, usually a lead-tin alloy, is deposited over the metallic layer 34 to form metallic bumps 38 that function as contact points for the wafer level package. Therefore, these metallic bumps 38 and the contact points on a package carrier or a printed circuit board can be directly bonded together. The metallic bumps 38 can be formed using conventional bump-forming methods or by electroplating.

Since the bonding pads 24 are located next to the edges of a silicon chip, the metallic bumps 38 are also located next to the edges. Therefore, both the top surface 40a (on the same side as the packaging layer 36) and the outer surface 40b (on the same side 35 as the edge of the chip 11) of the metallic bump 38 can act as contacting area for external connection. Hence, three-dimensional stacking of the wafer level packages is facilitated.

Figure 3:
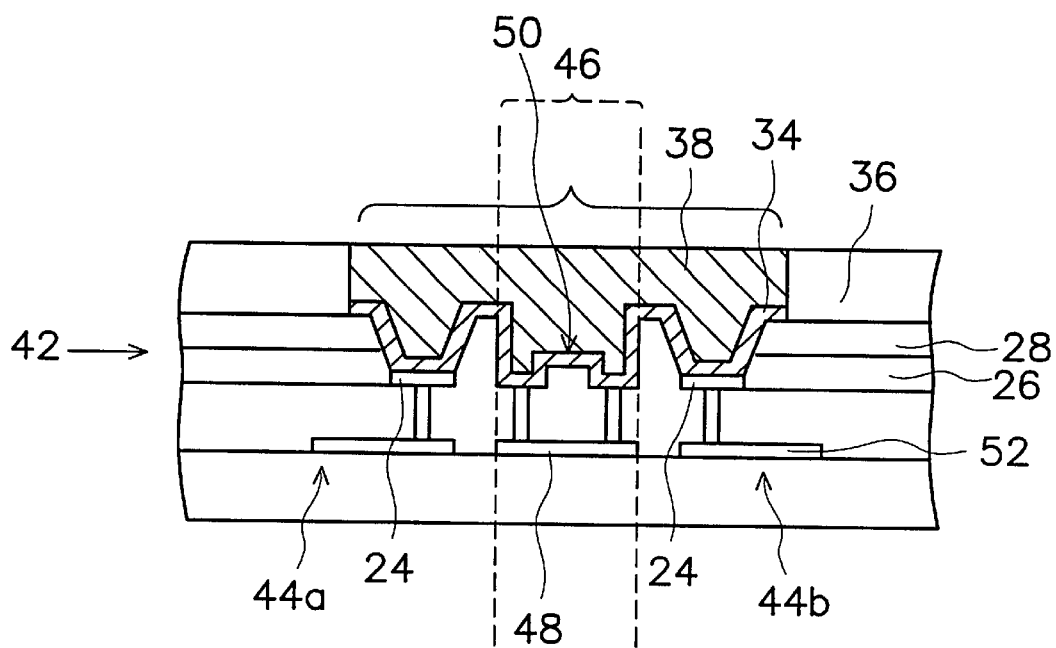
FIG. 3 is a cross-sectional view showing a portion of the wafer between two neighboring wafer level packages during the wafer stage according to this invention.

FIG. 3 is a cross-sectional view showing a portion of the wafer between two neighboring wafer level packages during the wafer stage according to this invention. Before a silicon wafer 42 is cut into individual wafer level packages 44a and 44b, the packages 44a and 44b are connected together via a scribe line section 46. By forming a testing circuit 48 and a few contact points 50 in the scribe line section 46, a multiple of testing operations can be carried out in the wafer stage. The testing circuit 48, the contact points 50, the metallic interconnects in the packages 44a and 44b are normally formed at the same time. Moreover, the testing circuit 48 or the testing points 50 can connect with devices or circuits to be tested in the packages via metallic interconnects or through the metallic layer 34 and the bonding pad 24.

In the conventional method of semiconductor manufacturing, a probing test needs to be carried out on a silicon wafer needs to carry out a probing test after the completion of circuit and bonding pad fabrication. The probing test is used to determine if individual silicon chips on the silicon wafer are operational or not. Thereafter, the silicon chips are cut up and separated into functional and non-functional chips. Only the functional chips are packaged. Then, the packaged silicon chips must undergo a final test just to ensure the integrated circuit package is still functional after all these operations. Finally, a burn-in test is carried out, and then a final test is needed just before shipment to a customer. In summary, several tests each involving complicated procedures have to be carried out. In comparison, the wafer level package of this invention is complete in the wafer stage. Therefore, as the silicon wafer is cut up to form individual chips, there is no need to perform any more packaging operations. Hence, product testing can be carried out in the wafer stage after the wafer level packaging. Since each of the chips in the wafer will be package, the probing test usually employed to separate out the good chips from the bad ones before packaging is unnecessary. Furthermore, since the wafer level package of this invention is targeted towards individual chips on the wafer, the first final test can be skipped as well. Therefore, only one final test needs to be carried out after performing the burn-in test. In addition, with the testing circuit and testing point formed on the scribe line section of the wafer, the burn-in test and the final test can be conveniently carried out in the wafer stage. Since all the chips on the wafer are tested at the same time, product testing will be greatly simplified and the cost of testing will be reduced too.

Figure 4:
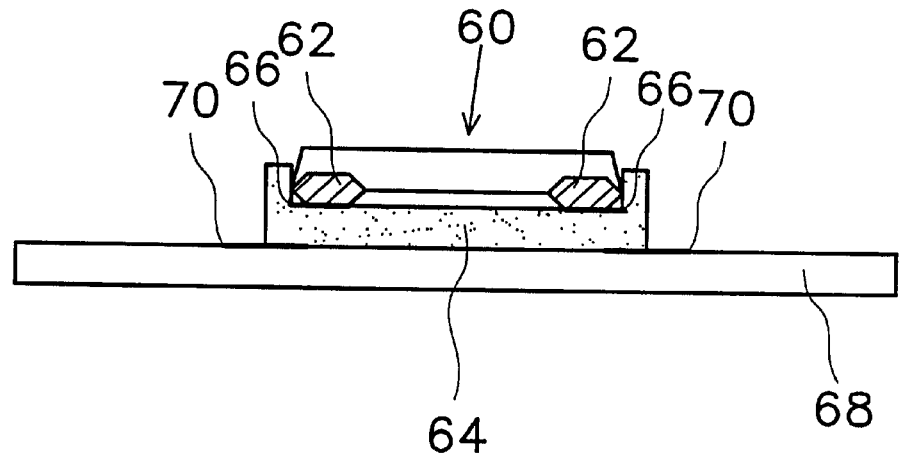
FIG. 4 is a cross-sectional side view showing a wafer level package mounted onto a printed circuit board via a package carrier according to this invention.

FIG. 4 is a cross-sectional side view showing a wafer level package mounted onto a printed circuit board via a package carrier according to this invention. As shown in FIG. 4, a socket type package carrier 64 is used to enclose a wafer level package 60 of this invention. The main body of the carrier 64 includes a central cavity having a multiple of contacting points 66 along the bottom edges and the sidewalls of the cavity for touching the metallic bumps 62 on wafer level package 60. If the package 60 and the carrier 64 have matching dimensions, the package 60 and the carrier 64 can be assembled together simply by pushing the package 60 down the carrier cavity similar to pressing a button. The outer edge of each metallic bump 62 can be used to contact a sidewall contact point of the package carrier 64. In addition, the top surface of each metallic bump 62 can be used to contact a bottom contact point of the package carrier 64. Due to the increase in contacting area between the metallic bump 62 and the contact points 66 in the package carrier 64, bonding between the two will be greatly improved after a thermal operation. The contact points 66 inside the cavity are re-directed to the external contacting points at the bottom of the package carrier 64 via some internal circuits. Finally, surface mount technology can be used to join the external contacting points with the circuit 70 in a printed circuit board 68.

Figure 5:
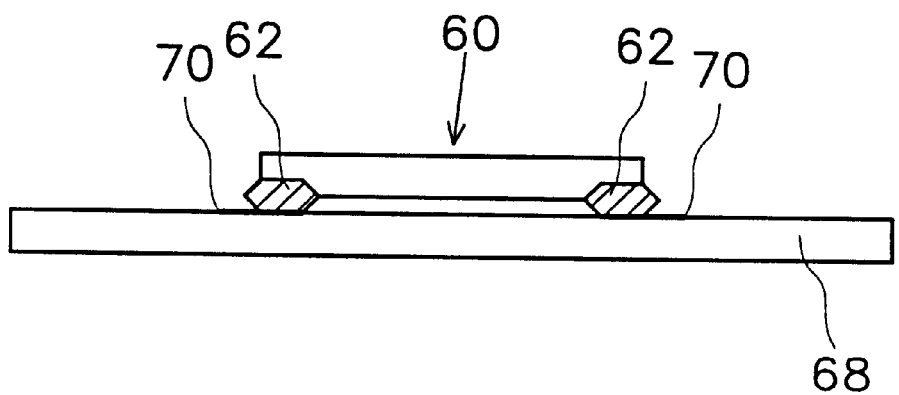
FIG. 5 is a cross-sectional side view showing a wafer level package directly attached to a printed circuit board according to this invention.

FIG. 5 is a cross-sectional side view showing a wafer level package directly attached to a printed circuit board according to this invention. In FIG. 5, the metallic bumps 62 of the wafer level package 60 are directly bonded to the corresponding contacting points on a printed circuit board 68. Hence, electrical signals are able to pass from the wafer level package to the circuit 70 on the printed circuit board 68 directly without having to go through a package carrier.

Figure 6A:
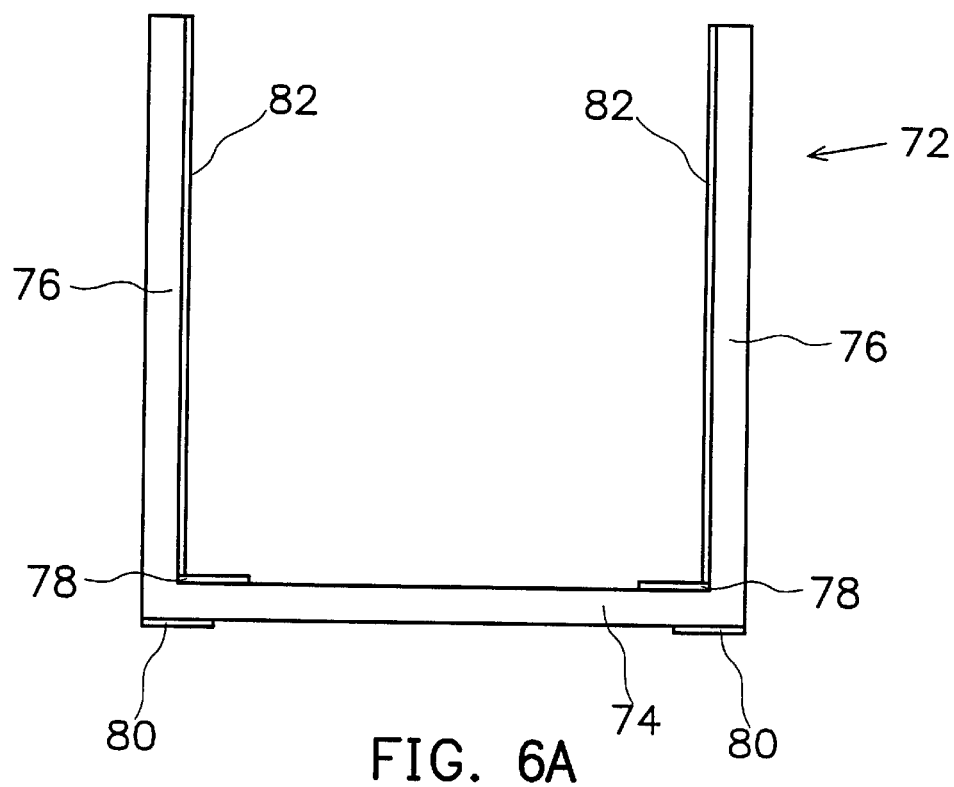
FIG. 6A is a cross-sectional side view showing a carrier suitable for stacking wafer level packages fabricated according to this invention.
Figure 6B:
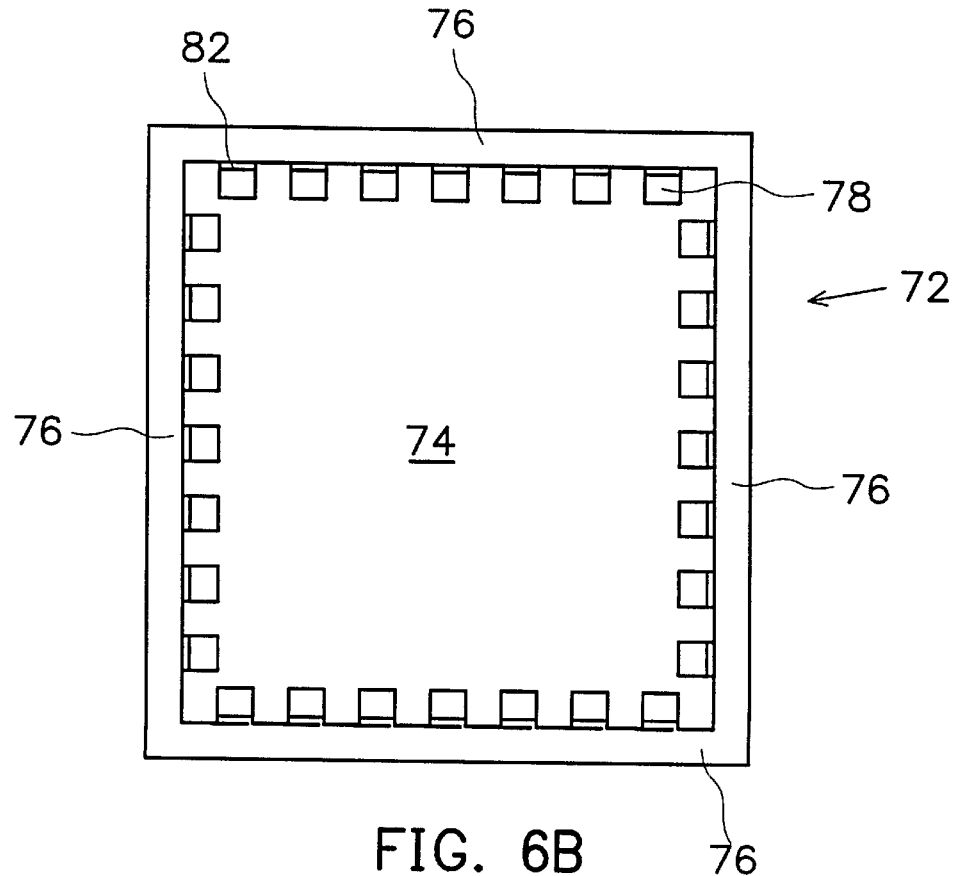
FIG. 6B is a top view of the carrier in FIG. 6A.

The wafer level package of this invention is also particularly suitable for three-dimensional stacking if an appropriate package carrier is designed. FIG. 6A is a cross-sectional side view showing a carrier suitable for stacking wafer level packages fabricated according to this invention, and FIG. 6B is a top view of the carrier in FIG. 6A. A suitable carrier 72 for stacking the wafer level packages of this invention should at least include a bottom panel 74 and a few vertical side panels 76. The bottom panel 74 and the vertical side panels 76 together form a carrier having a deep cavity. The upper surface of the bottom panel 74 has a multiple of contacting points 78 next to the edge of that panel. Similarly, the bottom surface of the bottom panel 74 also has the same number of contacting points 80 that correspond in position to the contacting points 78. Contacting points 78 and 80 are linked together by internal wires embedded inside the bottom panel 74. Furthermore, the wiring inside the bottom panel 74 can be as complicated as a multi-level printed circuit board. The vertical side panels 76 have a multiple of conductive lines 82 that correspond in position to the contacting points 78. In addition, each conductive line 82 is electrically coupled to its nearest contact point.

Figure 7:
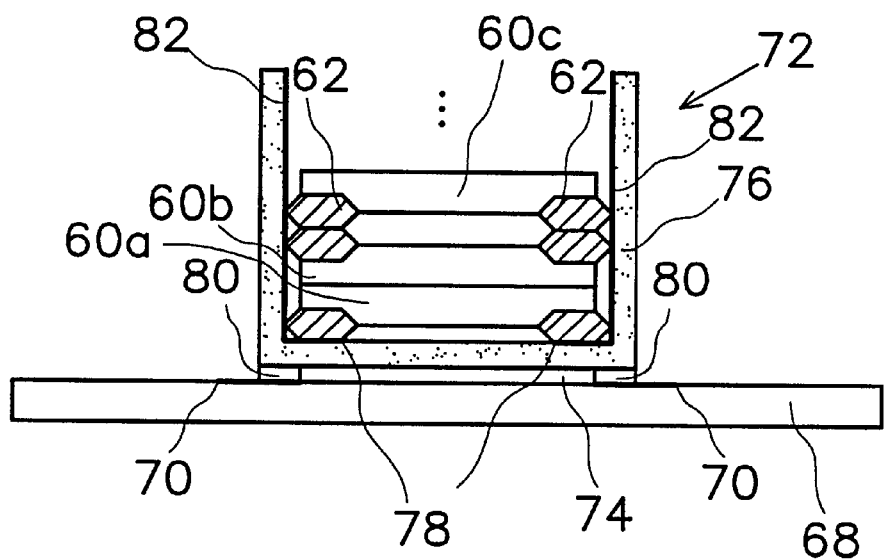
FIG. 7 is a cross-sectional side view showing a stack of wafer level packages inside a wafer stack carrier atop a printed circuit board.

FIG. 7 is a cross-sectional side view showing a stack of wafer level packages inside a wafer stack carrier atop a printed circuit board. A package carrier 72 similar to FIG. 6A and 6B can be used. In FIG. 7, several wafer level packages such as 60a, 60b and 60c are inserted into the cavity of the package carrier 72 resulting in a stacked package. The metallic bumps 62 of the wafer level package 60a face downward touching the bottom panel 74. Hence, the top surface and the outer edge of the metallic bumps can touch both the contacting points 78 on the bottom panel 74 and the conductive lines 82 on the vertical side panels 76. Obviously, the metallic bumps 62 of a wafer level package can face the other side as well. For example, the metallic bumps 62 of the wafer level package 60b in FIG. 7 face upward. Hence, the wafer level packages 60a, 60b and 60c are electrically connected through the conductive lines 82 or the contacting points 78 or both. Furthermore, the conductive lines 82 and the contacting points 78 are connected to the electrical circuit 70 inside a printed circuit board 68 via external contacting points 80 under the package carrier 72. Each wafer level package has a very small thickness. Moreover, distances between neighboring wafer level packages inside a stacked package are rather small. Hence, thickness of the assembled package will be smaller than a conventional stacked package.

In summary, the advantages of using the wafer level package and stacked wafer level package of this invention includes:

1. Due to the special button shape contacting points around the wafer level package, the wafer package is able to contact a package carrier or a printed circuit board directly. There is no need for a secondary media or any special packaging processes. Consequently, the signaling path is shortened and impedance including resistance, capacitance and inductance is reduced. Impedance reduction is one of the best methods to prevent signal delay and decay.

2. Dimensions of the wafer level package are one slightly bigger than the original chip. Hence, the package of this invention is in line with the current trend of miniaturizing chip scale packaging.

3. The wafer level package of this invention is especially suitable for three-dimensional stacking to form a stacked package. The stacked package has a thickness only slightly greater than stacking up individual chips. Hence, a higher level of integration is obtained without adding too much traveling distance for the signals. Moreover, additional signal decay and delay caused by stacking is minimal.

4. Test circuits are formed on the scribe line section and connection of the test circuits to their neighboring chips is also carried out during the wafer stage. In addition, the packaging of individual chips on the wafer is conducted before the dicing operation. These two changes in the chip fabricating operation eliminate the need to carry out a probe test. Furthermore, final test and burn-in test can be carried out directly during the wafer stage. Therefore, product testing is greatly simplified and testing cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level package, comprising:
    a silicon chip having at least one integrated circuit device;
    an insulation layer covering the integrated circuit device;
    a plurality of bonding pads above the insulation layer and distributed along the edges of the silicon chip, wherein each bonding pad is electrically connected to a terminal of the integrated circuit device;
    a passivation layer covering the insulation layer and a portion of the bonding pad, wherein the passivation layer has a plurality of openings each exposing a portion of the bonding pad;
    a metallic layer covering the interior side walls of the opening, the exposed bonding pad and the passivation layer surrounding the opening, and a portion of the metallic layer even extends from the opening to the edge of the silicon chip;
    a packaging layer over the passivation layer outside the area with metallic layer; and
    a plurality of metallic bumps over the metallic layer above each opening wherein the metallic bumps are located next to the edge of the silicon chip so that both a top surface and an outer surface of the metallic bump can act as a contacting area for external connections.

2. The wafer level package of claim 1, wherein the integrated circuit device comprises a MOS transistor, a resistor, a capacitor, an inductor, or a bipolar transistor or a combination thereof.

3. The wafer level package of claim 1, wherein the bonding pad is connected to a terminal of the integrated circuit device via a metallic interconnect passing through the insulation layer.

4. The wafer level package of claim 1, wherein the passivation layer comprises silicon oxide, silicon nitride, polyimide or a combination thereof.

5. The wafer level package of claim 1, wherein the metallic layer comprises copper, nickel, silver, palladium, palladium-nickel alloy, gold, titanium, or titanium nitride or a combination thereof.

6. The wafer level package of claim 1, wherein the packaging layer comprises epoxy.

7. The wafer level package of claim 1, wherein the metallic bump comprises lead-tin alloy.

8. A silicon wafer structure for producing wafer level package, comprising:
    a silicon wafer made up of a plurality of silicon chips with each chip having at least an integrated circuit device, and furthermore two neighboring silicon chips are connected by a scribe line section;
    an insulation layer covering the silicon wafer;
    a plurality of bonding pads distributed around the edges of each silicon chip, and each bonding pad is electrically connected to a terminal of the integrated circuit device;
    a plurality of circuits for chip testing formed on the scribe line sections, and the circuits are electrically connected to the integrated circuit device and bonding pad of a neighboring silicon chip;
    a plurality of contacting points leading to the circuit on each scribe line section;
    a passivation layer formed over the insulation layer and a portion of each bonding pad such that a plurality of openings that expose the respective bonding pads is formed;
    a metallic layer covering the interior side walls of the opening, the exposed bonding pad and the passivation layer surrounding the opening, and a portion of the metallic layer even extends from the opening to the edge of the silicon chip;
    a packaging layer over the passivation layer outside the area with metallic layer; and
    a plurality of metallic bumps over the metallic layer above each opening wherein the metallic bumps are located next to the edge of the silicon chip so that both a top surface and an outer surface of the metallic bump can act as a contacting area for external connections.

9. The silicon wafer of claim 8, wherein the integrated circuit device comprises a MOS transistor, a resistor, a capacitor, an inductor, or a bipolar transistor or a combination thereof.

10. The silicon wafer of claim 8, wherein the bonding pad is connected to a terminal of the integrated circuit device via a metallic interconnect passing through the insulation layer.

11. The silicon wafer of claim 8, wherein the passivation layer comprises silicon oxide, silicon nitride, or polyimide or a combination thereof.

12. The silicon wafer of claim 8, wherein the metallic layer comprises copper, nickel, silver, palladium, palladium-nickel alloy, gold, titanium or titanium nitride or a combination thereof.

13. The silicon wafer of claim 8, wherein the packaging layer comprises epoxy.

14. The silicon wafer of claim 8, wherein the metallic bump comprises lead-tin alloy.

15. A stack-up structure of wafer level packages, comprising:

a wafer level packages carrier having at least a bottom panel and a plurality of vertical side panels attached to the edges of the bottom panel, wherein the bottom panel has a plurality of first contacting points on the upper side of the bottom panel and a plurality of second contacting points on the lower side of the bottom panel such that each first contacting point is electrically coupled to a second contacting point, furthermore, the vertical side panel also has a plurality of conductive lines along its surface with each line electrically coupled to one of the first contacting points; and a plurality of wafer level packages, each of these wafer level packages comprising:

a silicon chip having at least one integrated circuit device;

an insulation layer covering the integrated circuit device;

a plurality of bonding pads above the insulation layer and distributed along the edges of the silicon chip, wherein each bonding pad is electrically connected to a terminal of the integrated circuit device;

a passivation layer covering the insulation layer and a portion of the bonding pad, wherein the passivation layer has a plurality of openings each exposing a portion of the bonding pad;

a metallic layer covering the interior side walls of the opening, the exposed bonding pad and the passivation layer surrounding the opening, and a portion of the metallic layer even extends from the opening to the edge of the silicon chip;

a packaging layer over the passivation layer outside the area with metallic layer; and a plurality of metallic bumps over the metallic layer above each opening, wherein the wafer level packages stack up from the bottom panel such that the metallic bumps of the package closest to the bottom panel is able to contact the first contacting points of the carrier whereas the metallic bumps of other packages contact the conductive lines along the vertical side panels of the carrier.

16. The stack-up structure of claim 15, wherein the integrated circuit device is selected from the group consisting of a MOS transistor, a resistor, a capacitor, an inductor, a bipolar transistor and the combination thereof.

17. The stack-up structure of claim 15, wherein the bonding pad is connected to one terminal of the integrated circuit device via a metallic interconnect passing through the insulation layer.

18. The stack-up structure of claim 15, wherein the passivation layer is selected from the group consisting of a silicon oxide layer, a silicon nitride layer, a polyimide layer and the combination thereof.

19. The stack-up structure of claim 15, wherein the metallic layer is selected from the group consisting of a copper layer, a nickel layer, a silver layer, a palladium layer, a palladium-nickel alloy layer, a gold layer, a titanium layer, a titanium nitride layer and the combination thereof.

20. The stack-up structure of claim 15, wherein the packaging layer can be an epoxy layer.

21. The stack-up structure of claim 15, wherein the metallic bump can be made from a material including a lead-tin alloy.

* * * * *